United States Patent
Chen et al.

(10) Patent No.: US 10,211,072 B2
(45) Date of Patent: Feb. 19, 2019

(54) METHOD OF RECONSTITUTED SUBSTRATE FORMATION FOR ADVANCED PACKAGING APPLICATIONS

(71) Applicant: Applied Materials, Inc., Santa Clara, CA (US)

(72) Inventors: Han-Wen Chen, Cupertino, CA (US); Steven Verhaverbeke, San Francisco, CA (US); Roman Gouk, San Jose, CA (US); Guan Huei See, Singapore (SG); Yu Gu, Singapore (SG); Arvind Sundarrajan, Singapore (SG); Kyuil Cho, Santa Clara, CA (US); Colin Costano Neikirk, Sunnyvale, CA (US); Boyi Fu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/840,900

(22) Filed: Dec. 13, 2017

(65) Prior Publication Data

US 2018/0374718 A1 Dec. 27, 2018

Related U.S. Application Data

(60) Provisional application No. 62/524,298, filed on Jun. 23, 2017.

(51) Int. Cl.
*H01L 21/50* (2006.01)
*H01L 21/56* (2006.01)
*H01L 23/31* (2006.01)

(52) U.S. Cl.
CPC .......... *H01L 21/561* (2013.01); *H01L 21/568* (2013.01); *H01L 23/3135* (2013.01)

(58) Field of Classification Search
CPC .. H01L 21/561; H01L 21/568; H01L 23/3135
(Continued)

(56) References Cited

U.S. PATENT DOCUMENTS 5,866,953 A * 2/1999 Akram ................. H01L 21/563
257/687
6,049,124 A * 4/2000 Raiser ................. H01L 21/563
257/712
(Continued)

FOREIGN PATENT DOCUMENTS

KR 20130123682 11/2013

OTHER PUBLICATIONS

Dvorak, Paul—"Think Parylene for thin, complete, pin-hole free coatings," Medical Design & Outsourcing Webpage, Sep. 7, 2018, https://www.medicaldesignandoutsourcing.com/think-parylene-thin-complete-pin-hole-free-coatings/, 4 pages.
(Continued)

*Primary Examiner* — Luan C Thai
(74) *Attorney, Agent, or Firm* — Patterson + Sheridan LLP (57) ABSTRACT

Embodiments of the present disclosure generally describe methods for minimizing the occurrence and the extent of die shift during the formation of a reconstituted substrate in fan-out wafer level packaging processes. Die shift is a process defect that occurs when a die (device) moves from its intended position within a reconstituted substrate during the formation thereof. Generally, the methods disclosed herein include depositing a device immobilization layer and/or a plurality of device immobilization beads over and/or adjacent to a plurality of singular devices (individual dies), and the carrier substrate they are positioned on, before forming a reconstituted substrate with an epoxy molding compound. The device immobilization layer and/or the
(Continued)

plurality of device immobilization beads immobilize the plurality of singular devices and prevents them from shifting on the carrier substrate during the molding process.

17 Claims, 8 Drawing Sheets

(58) Field of Classification Search
USPC .......................................................... 438/126
See application file for complete search history.

(56) References Cited

U.S. PATENT DOCUMENTS

| | | | |
|---|---|---|---|
| 6,154,366 A * | 11/2000 | Ma ....................... | H01L 23/5389 257/700 |
| 6,492,194 B1 * | 12/2002 | Bureau ................... | H01L 21/56 257/E21.502 |
| 6,722,030 B1 * | 4/2004 | Stelzl .................... | H01L 23/552 174/541 |
| 6,844,623 B1 | 1/2005 | Peterson et al. | |
| 7,259,041 B2 * | 8/2007 | Stelzl .................... | H01L 21/561 257/659 |
| 7,662,667 B2 * | 2/2010 | Shen ..................... | H01L 21/568 438/112 |
| 7,843,074 B2 * | 11/2010 | Gao ....................... | H01L 24/73 257/779 |
| 7,916,496 B2 * | 3/2011 | Sugai .................... | H05K 3/305 361/763 |
| 7,993,984 B2 * | 8/2011 | Yokota .................. | B23K 1/018 257/795 |
| 8,309,454 B2 | 11/2012 | Brunnbauer et al. | |
| 9,293,423 B2 * | 3/2016 | Brunnbauer .......... | H01L 21/561 |
| 9,324,585 B2 * | 4/2016 | Chang ................... | H01L 21/568 |
| 9,331,047 B2 * | 5/2016 | Ohashi .................. | H01L 24/83 |
| 2011/0045349 A1 | 2/2011 | Pushparaj et al. | |
| 2012/0268899 A1 | 10/2012 | Haba et al. | |
| 2013/0337615 A1 | 12/2013 | Xu et al. | |
| 2016/0099212 A1 | 4/2016 | Vincent | |
| 2016/0163682 A1 | 6/2016 | Brunnbauer et al. | |
| 2017/0033009 A1 | 2/2017 | Scanlan et al. | |

OTHER PUBLICATIONS

PCT International Search Report and Written Opinion dated Sep. 21, 2018, for International Application No. PCT/US2018/036277.

* cited by examiner

METHOD OF RECONSTITUTED SUBSTRATE FORMATION FOR ADVANCED PACKAGING APPLICATIONS

CROSS-REFERENCE TO RELATED APPLICATIONS

This application claims priority to U.S. Provisional Patent Application Ser. No. 62/524,298, filed on Jun. 23, 2017, which is herein incorporated by reference in its entirety.

BACKGROUND

Field

Embodiments described herein generally relate to the field of semiconductors, and more specifically, to methods of packaging semiconductor devices.

Description of the Related Art

As circuit densities increase and device sizes decrease for next generation semiconductor devices, providing the external connections, i.e., wiring, to these devices requires advanced packaging technologies. One such advanced packaging technology is wafer level packaging.

Wafer level packaging streamlines the manufacturing and packaging processes of semiconductor devices by integrating device manufacturing, package assembly (packaging), electrical testing, and reliability testing (burn-in) at the wafer level, where forming of the top and bottom layers of the packaging, creating the I/O connections, and testing the packaged device are all performed before the devices are singulated into individual packaged components. The advantages of wafer level packaging include reduced overall manufacturing costs of the resulting device, reduced package size, and improved electrical and thermal performance. However, typical wafer level packaging schemes limit the number of I/O connections that can be made from the semiconductor device to the number of I/O terminals that can be spread over the surface of the die. Fan-out wafer level packaging retains the advantages of wafer level packaging while increasing the area available for I/O terminals by redistributing the I/O terminals to areas exterior of the surface of the die, using one or more redistribution layers.

Fan-out wafer level packaging processes require that the surface area of the I/O terminal redistribution layer for each individual die be larger than the surface area of the individual die itself. However, because it is desirable to maximize the number of devices (dies) on a wafer in order to minimize costs during manufacturing of the device, the spaces between individual devices (dice lines) are usually only large enough to accommodate the width of the dicing saw used to dice the wafer into its individual dies. One method of creating the desired additional surface area external of the die surface is to form a new wafer with dies redistributed in a spaced apart pattern, known as a reconstituted substrate.

Typically, to form a reconstituted substrate, a wafer is singulated into individual die which are then positioned on a molding plate (carrier substrate) spaced apart from one another and temporarily secured thereto by an adhesion layer. A molding compound is dispensed onto the carrier substrate, and the dies secured thereto, and subsequently cured, which embeds the spaced apart dies in the molding compound to form the reconstituted substrate. The terminal sides of the dies are then exposed by removing the adhesion layer, and redistribution layers, having interconnects disposed therein, are subsequently formed on the reconstituted substrate, to redistribute a portion, or all, of the device's I/O terminals to areas exterior of the surface of the die, which increases the area available for I/O connections and thus the number of possible I/O terminals.

Process defects associated with forming the reconstituted substrate, such as undesirable repositioning of the dies within the reconstituted substrate from their original placement location on the adhesion layer, also known as die shift, cause misalignment between the via interconnects in the subsequently formed redistribution layer and the electrical contacts on the dies. Additionally, the redistribution layers are typically formed using conventional photolithography and etch processes which are costly, equipment intensive, and time consuming.

Accordingly, there is a need in the art for improved methods of forming reconstituted substrates for fan-out wafer level packaging schemes.

SUMMARY

Embodiments herein generally relate to device packaging processes, and in particular, relate to methods of forming a reconstituted substrate in a fan-out wafer level packaging process.

In one embodiment, a method of forming a reconstituted substrate is provided. The method includes positioning a plurality of devices on a carrier substrate. Herein, the carrier substrate comprises a structural base and an adhesion layer disposed on a major surface thereof, where the active surfaces of the plurality of singular devices are temporarily secured to the structural base by the adhesion layer. The method further includes depositing a device immobilization layer onto the plurality of singular devices and onto at least a portion of the carrier substrate adjacent thereto and extending laterally outward therefrom, wherein depositing the device immobilization layer comprises a HWCVD process, a PECVD process, a controlled dispense process, a spray process, an additive manufacturing process, or a combination thereof.

In another embodiment, another method of forming a reconstituted substrate is provided. The method includes positioning a plurality of devices on a carrier substrate. Herein, the carrier substrate comprises a structural base and an adhesion layer disposed on a major surface thereof, where the active surfaces of the plurality of singular devices are temporarily secured to the structural base by the adhesion layer. The method further includes dispensing a plurality of droplets of a precursor composition onto the carrier substrate at locations adjacent to each of the plurality of devices, and at least partially curing each of the plurality of dispensed droplets to form a plurality of device immobilization beads.

In another embodiment, a reconstituted substrate is provided. The reconstituted substrate comprises a plurality of devices disposed in a molding compound, wherein an immobilization layer or a plurality of immobilization beads is interposed between each of the plurality of devices and the molding compound, and wherein the immobilization layer or the plurality of immobilization beads comprises parylene, urethane acrylate, epoxy acrylate, thermal and/or UV curable modifications thereof, or combinations thereof. In some embodiments, the reconstituted substrate further comprises a polymer layer disposed on the plurality of devices, the polymer layer having a plurality of metal interconnect structures disposed therethrough. In some embodiments, the reconstituted substrate further comprises an electrostatic discharge layer interposed between the mold layer and the device. In some embodiments, the immobilization layer has a thickness between about 0.5 μm and 100 μm. In some embodiments, the polymer layer comprises polyimide.

In another embodiment, a packaged device is provided. The packaged device comprises a first layer including a mold layer, a device disposed in the mold layer, an second layer interposed between at least a portion of the mold layer and at least a portion of the device, and a first surface defined by an active surface of the device and a surface or surfaces of the second layer. The packaged device further comprises one or more redistribution layers disposed on the first surface, each redistribution layer comprising at least a dielectric layer and a plurality of interconnect structures disposed therethrough. In some embodiments, the second layer comprises parylene, urethane acrylate, epoxy acrylate, modifications thereof (e.g. thermal and/or UV curable), or combinations thereof. In some embodiments, the second layer has a thickness of between about 0.5 μm and about 100 μm. In some embodiments, the mold layer comprises an epoxy. In some embodiments, the dielectric layer comprises a polyimide. In some embodiments, the packaged device further comprises a conductive layer interposed between the mold layer and the device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5A(1) is a schematic plan view of a device disposed on a carrier substrate, according to one embodiment.

FIG. 5A(2) is a side view of the device shown in FIG. 5B(1).

FIG. 5B(1) is a schematic plan view of a device disposed on a carrier substrate, according to one embodiment.

FIG. 5B(2) is a side view of the device 204 shown in FIG. 5B(1).

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally describe methods for minimizing the occurrence and extent of die shift during the formation of a reconstituted substrate in fan-out wafer level packaging processes.

Die shift is a process defect that occurs when a die (device) moves from its intended position within a reconstituted substrate during the formation thereof. Generally, the methods disclosed herein include depositing a device immobilization layer and/or a plurality of device immobilization beads over and/or adjacent to a plurality of singulated dies (individual dies), and the carrier substrate they are positioned on, before forming a reconstituted substrate with an epoxy molding compound. The device immobilization layer and/or the plurality of device immobilization beads immobilize the plurality of singular devices and prevent them from shifting on the carrier substrate during the molding process.

Typically, some tolerance in alignment between the interconnects in the redistribution layers and the device contact pads in a fan-out wafer level packaging scheme must be built into the manufacturing process to account for die shift. For example, die shift can cause a die to deviate from its intended position in a reconstituted substrate by 20 μm to 140 μm or more which causes misalignment between via interconnects in a subsequently formed redistribution layer and the contact sites on the die. One contributing factor to die shift is the drag force the molding compound exerts on the die as the molding compound is dispensed onto the molding plate (carrier) and/or into a mold, such as a compression mold. Additional factors contributing to die shift are deformation of the molding compound during curing, warping of the reconstituted substrate, and thermal expansion/contraction of the molding compound and/or reconstituted substrate. By immobilizing the plurality of singular devices on a carrier substrate using the methods described herein, die shift is eliminated or substantially reduced. Eliminating or substantially reducing die shift desirably enables precise alignment of interconnect layers and scaling of via/pitch dimensions which desirably allows for a reduction in the final package size of a device.

Figure 1A:
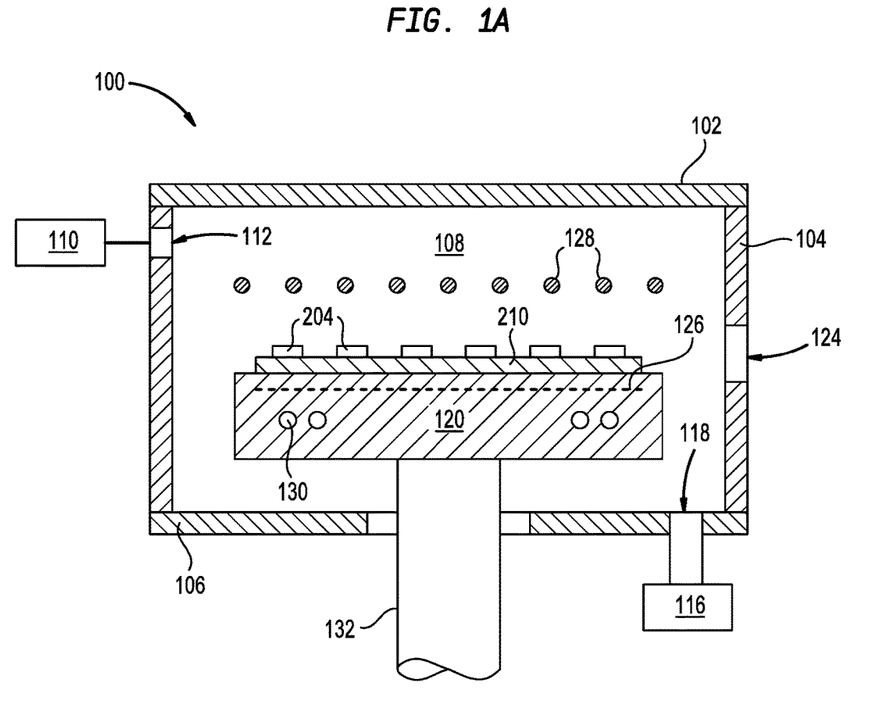
FIG. 1A is a schematic cross-sectional view of an example processing chamber, herein a hot-wire chemical vapor deposition (HWCVD) chamber, used to practice some of methods described herein, according to one embodiment.

FIG. 1A is a schematic cross-sectional view of an example processing chamber, herein a hot-wire chemical vapor deposition (HWCVD) chamber, used to practice some of methods described herein, according to one embodiment.

The processing chamber 100 includes a chamber lid 102, one or more sidewalls 104, and a chamber bottom 106, which define a processing volume 108. The processing volume 108 is in fluid communication with a vacuum source 116, such as one or more dedicated vacuum pumps, through a vacuum outlet 118, which maintains the processing volume 108 at sub-atmospheric conditions and evacuates processing gases, and other gases, therefrom. A carrier substrate support 120, disposed on a support shaft 132 sealingly extending through the chamber bottom 106, is disposed in the processing volume 108 and a carrier substrate 210 is transferred thereto and therefrom through an opening 124 formed through the sidewall 104, which is sealed with a door or a valve (not shown) during the deposition process. Typically, the carrier substrate 210 is positioned on, and removed from, the carrier substrate support 120 using a conventional lift pin system (not shown). In some embodiments, the carrier substrate support 120 is configured to heat, cool, and/or to maintain the carrier substrate 210 at a desired processing temperature using a resistive heater 126 embedded in and or disposed on the carrier substrate support 120 and/or cooling conduits 130 disposed in the carrier substrate support 120. Typically the resistive heater 126 is coupled to a DC power supply which provides current thereto and the cooling conduits 130 are fluidly coupled to a cooling source (not shown), such as a water or refrigerant source.

The processing chamber 100 further includes a plurality of heating elements, herein a plurality of wires 128, disposed in the processing volume 108 between the carrier substrate support 120, and the carrier substrate 210 disposed thereon, and the chamber lid 102. The plurality of wires 128 are formed of a conductive material, such as a steel alloy, and are electrically coupled to a power supply (not shown). Herein, the processing volume 108 is fluidly coupled to one or more gas supplies, such as gas supply 110, which provides processing gases to the processing volume 108 through one or more gas inlets, such as gas inlet 112 disposed through a sidewall 104 at a location between a horizontal plane of the plurality of wires 128 and the chamber lid 102. In other embodiments, the gas inlet 112 is disposed through the chamber lid 102. In some embodiments, the processing chamber 100 further includes a gas distributor (not shown), such as a showerhead, disposed between the gas inlet 112 and the carrier substrate support 120 and the carrier substrate 210 disposed thereon. In embodiments herein, the processing gases include one or more monomers and one or more initiator gases. During the HWCVD deposition process the plurality of wires 128 are resistively heated by electrical current flowing therethrough to a desired temperature sufficient to catalytically dissociate the initiator gases into their reactive species, e.g. radicals. The monomer gas(es), absorbed onto a surface of the carrier substrate 210, react with the dissociated reactive species of the initiator gas(es) to deposit and/or form a polymer layer, herein an immobilization layer 206, on the surface of the carrier substrate 210. Typically, a pressure in the processing volume 108 is maintained at less than about 1 Torr, such as less than about 700 mTorr, such as between about 400 mTorr and about 1 Torr, or between about 400 mTorr and about 700 mTorr.

Figure 1B:
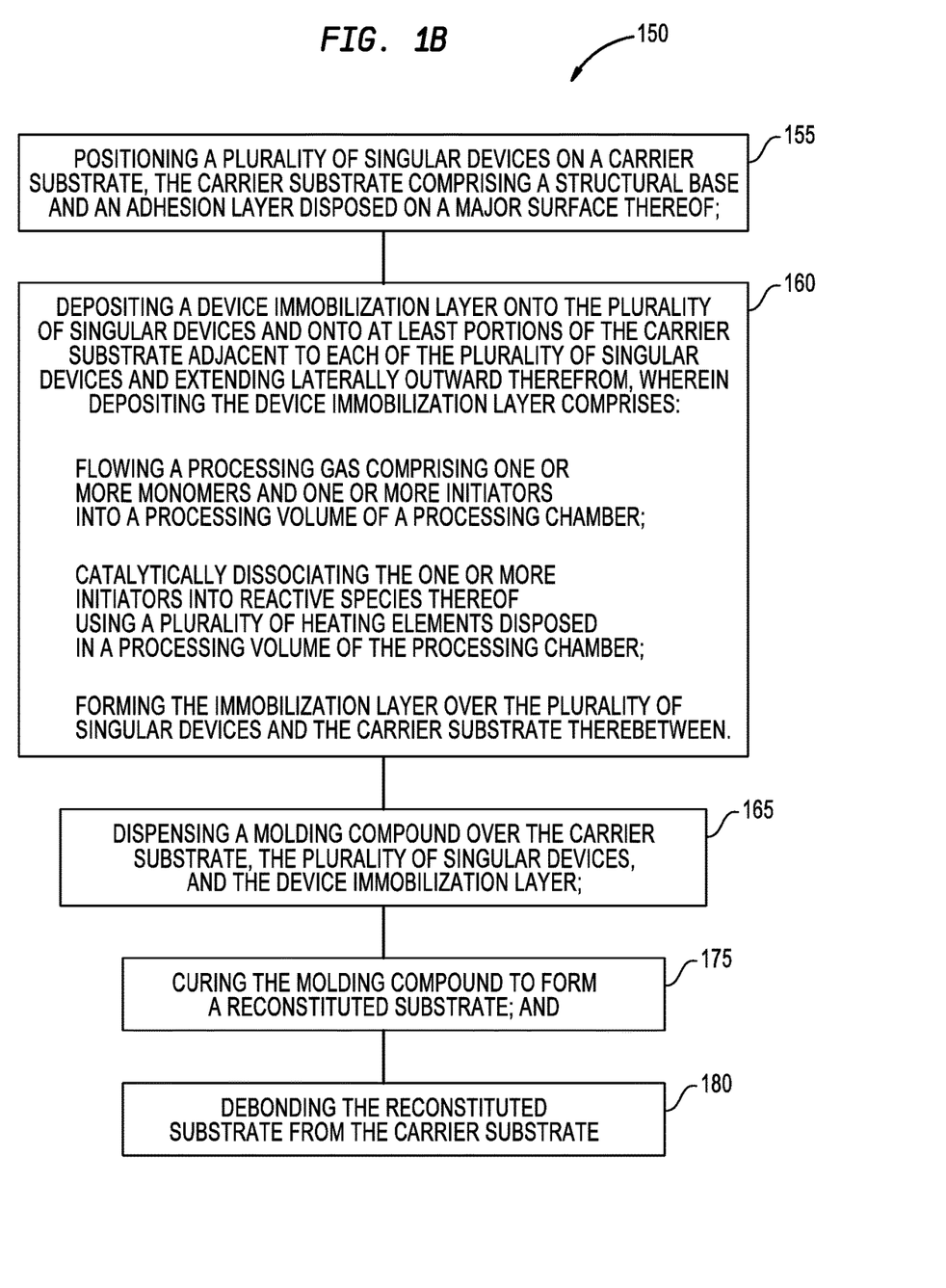
FIG. 1B is a flowchart illustrating a method for forming a reconstituted substrate, according to one embodiment.

FIG. 1B is a flowchart illustrating a method 150 for forming a reconstituted substrate, according to one embodiment. FIGS. 2A-2E illustrate the formation of a reconstituted substrate 212, according to the method of FIG. 1B.

Figure 2A:
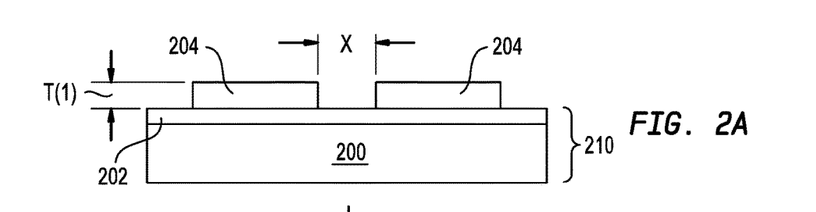
FIGS. 2A-2E illustrate the formation of a reconstituted substrate, according to the method of FIG. 1B.
Figure 2B:
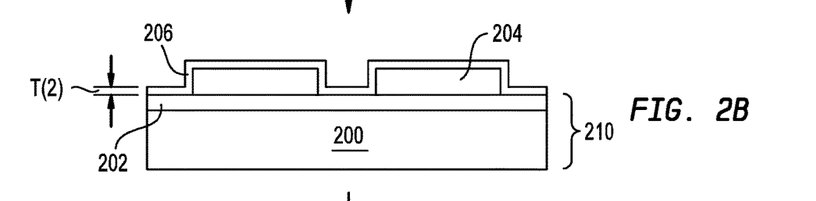

The method 150 begins at activity 155 with the positioning of a plurality of devices, i.e., individual singular devices, on a carrier substrate. A carrier substrate 210 is illustrated in FIG. 2A and it includes a structural base 200 having an adhesion layer 202 disposed on a major surface thereof. Herein, the structural base 200 is a rigid substrate, such as a silicon wafer or a metal plate. In other embodiments, the structural base 200 is a rectangular panel made from a material having sufficient rigidity to act as a mold plate, such as glass or a rigid polymer. In some embodiments, the structural base 200 is made from glass or a rigid polymer. Herein, the adhesion layer 202 is a double sided tape, a temporary adhesive bonding film, a thermally releasable adhesive, a photo-releasable adhesive, or any suitable adhesive layer for temporarily securing the active surfaces of a plurality of devices 204 to the structural base 200. Herein, each of the plurality of devices 204 has a thickness T(1) of between about 50 μm and about 800 μm, such as between about 50 μm and about 760 μm, between about 50 μm and about 400 μm, or between about 50 μm and about 300 μm, such as between about 100 μm and about 300 μm. Typically, each of the plurality of devices 204 are spaced apart from one another by a distance X so that a portion of the structural base 200 associated with each device 204 has a redistribution surface area that is greater than the surface area of the device 204. The size of the redistribution surface determines the surface area available for the formation of redistribution layers on the to be formed reconstituted substrate. The method 150 continues at activity 160 with depositing an immobilization layer 206 over the plurality of devices 204 and the adhesion layer 202, as shown in FIG. 2B. Herein, the immobilization layer 206 is a polymer, such as parylene, urethane acrylate, epoxy acrylate, modifications thereof, or combinations thereof, deposited using a chemical vapor deposition (CVD) process, a hot wire CVD process, a plasma enhanced CVD process (PECVD), or a controlled dispense and/or spray process. In some embodiments, the immobilization layer 206 is formed by depositing a UV curable polymer precursor (using a controlled dispense and/or spray process) over the plurality of devices 204 and the carrier substrate 210 and exposing the deposited UV curable polymer precursor, or portions thereof, to UV radiation from a UV radiation source.

In one embodiment, the immobilization layer 206 is deposited and/or formed using a HWCVD process in a HWCVD processing chamber, such as the processing chamber 100 described in FIG. 1A. Typically, the HWCVD process comprises flowing a processing gas comprising one or more monomers and one or more initiators into the processing volume of a processing chamber. The one or more monomers are absorbed onto surfaces of the carrier substrate 210 and the plurality of devices 204 disposed thereon. The one or more initiators are dissociated into their reactive species by a plurality of heated wires maintained at a temperature less than about 600° C., such as less than about 450° C., for example between about 100° C. and about 450° C. The absorbed monomers react with the dissociated reactive species of the initiator precursor to deposit or form the immobilization layer 206 over the carrier substrate 210 and the plurality of devices 204 disposed thereon. Immobilization layers 206 deposited using the HWCVD methods described herein comprise the polymerized reaction product of the one or more monomer gases and the dissociated reactive species of one or more initiator precursors.

Monomer gases herein include ethyleneglycol diacrylate, t-butylacrylate, N,N-dimethylacrylamide, vinylimidazole, 1-3-diethynylbenzene, 4-vinyl pyridine, poly vinyl pyridine, poly 4-vinyl pyridine, polyphenylacetylene, N,N-dimethylaminoethylmethacrylate, divinylbenzene, poly divinylbenzene, glycidyl methacrylate, poly thiophene, ethyleneglycol dimethacrylate, tetrafluoroethylene, dimethylaminomethylstyrene, perfluoroalkyl ethylmethacrylate, trivinyltrimethoxy-cyclotrisiloxane, furfuryl methacrylate, cyclohexyl methacrylate-co-ethylene glycol dimethacrylate, pentafluorophenyl methacrylate-co-ethylene glycol diacrylate, 2-hydroxyethyl methacrylate, methacrylic acid, 3,4-ethylenedioxythiophene, and combinations thereof. In some embodiments, the monomer gas further include a cross-linker source gas to facilitate the cross-linking of the to be formed immobilization layer 206. Cross-linker source gases here include 2-ethyl-2(hydroxymethyl)propane-trimethyacrylate (TRIM), acrylic acid, methacrylic acid, trifluoromethacrylic acid, 2-vinylpyridine, 4-vinylpyridine, 3(5)-vinylpyridine, p-methylbenzoic acid, itaconic acid, 1-vinylimidazole, ethylene glycol dimethacrylate, and combinations thereof.

Initiator precursors herein include, hydrogen peroxide, alkyl peroxides, aryl peroxides, hydroperoxides, halogens, azo compounds, and combinations thereof. In some embodiments, the initiator source gas is selected from the group including perfluorooctane sulfonyl fluoride (PFOS), perfluorobutane-1-sulfonyl fluoride (PFBS), triethylamine (TEA), tert-butyl peroxide (TBPO), 2,2'-azobis (2-methylpropane), tert-amyl peroxide (TAPO), di-tert-amyl peroxide, antimony pentachloride and benzophenone, and combinations thereof. Typically, a ratio of initiator precursor to monomer gas is between about 1:10 and about 1:1.

The polymerized reaction products herein include poly (glycidyl methacrylate-co-divinylbenzene), poly(glycidyl methacrylate-co-methacrylamide), poly(ethyleneglycol diacrylate), poly(t-butylacrylate), poly N,N-dimethylacrylamide, poly(vinylimidazole), poly(1-3-diethynylbenzene), poly (phenylacetylene), poly(N,N-dimethylaminoethylmethacrylate) (p(DMAM), poly (divinylbenzene), poly(glycidyl methacrylate) (p(GMA)), poly (ethyleneglycol dimethacrylate), poly (tetrafluoroethylene), poly(tetrafluoroethylene) (PTFE), poly(dimethylaminomethylstyrene) (p(DMAMS), poly(thiophene), poly(vinylpyridine), poly(perfluoroalkyl ethylmethacrylate), poly (trivinyltrimethoxy-cyclotrisiloxane), poly(furfuryl methacrylate), poly(cyclohexyl methacrylate-co-ethylene glycol dimethacrylate), poly(pentafluorophenyl methacrylate-co-ethylene glycol diacrylate), poly(2-hydroxyethyl methacrylate-co-ethylene glycol diacrylate), poly(methacrylic acid-co-ethylene glycol dimethacrylate), poly(3,4-ethylenedioxythiophene), and combinations thereof.

In one embodiment, the immobilization layer 206 comprises HWCVD deposited poly(glycidyl methacrylate) (p(GMA)) having a thickness T(2) of more than about 1 µm, such as between about 1 µm and about 20 µm, or more than about 8 µm for a device 204 having a thickness T(1) of more than about 700 µm and less than about 8 µm for a singulated die having a thickness T(1) of less than about 700 µm.

In some embodiments, the processing gas further includes a carrier gas or a diluent gas, such as one or more inert gases, for example helium (He), neon (Ne), argon (Ar), or combinations thereof. In some embodiments, the one or more monomer gases and the one or more initiator precursor gases are provided separately to the processing volume of the processing chamber and allowed to mix therein.

In some embodiments, the immobilization layer 206 forms a continuous closed surface over the plurality of devices 204 and the adhesion layer 202 exposed therebetween. Herein, the immobilization layer 206 has a thickness of between about 0.5 µm and 100 µm, such as between about 0.5 µm and about 50 µm, between about 0.5 µm and 20 µm, between about 0.5 µm and about 10 µm, or between about 0.5 µm and 5 µm. In other embodiments, the immobilization layer 206 has a thickness of more than about 100 µm or less than about 0.5 µm.

In other embodiments, the immobilization layer 206 forms a discontinuous surface comprising a plurality of immobilization layer regions, herein immobilization patches 207 (shown in phantom in FIG. 2F), each disposed over a respective device 204 and portions of the respective adhesion layer 202 adjacent thereto. In some embodiments, the discontinuous surface of the immobilization layer 206 is formed using a physical mask (i.e. a shadow mask) during the deposition thereof, by a subsequent photolithography/etch process, or by any other suitable means. In some embodiments, the discontinuous surface of the immobilization layer 206 is formed by selectively curing portions of the UV curable polymer precursor to form the plurality of immobilization layer regions and removing the uncured polymer precursor from surfaces of the structural base 200 and/or portions of the adhesion layer 202.

In some other embodiments, the immobilization layer 206 forms a continuous surface over the plurality of devices 204 and over portions of the adhesion layer 202 exposed therebetween but has openings (not shown) in the continuous surface between the portions of the adhesion layer 202 covered by the immobilization layer 206.

Figure 2C:
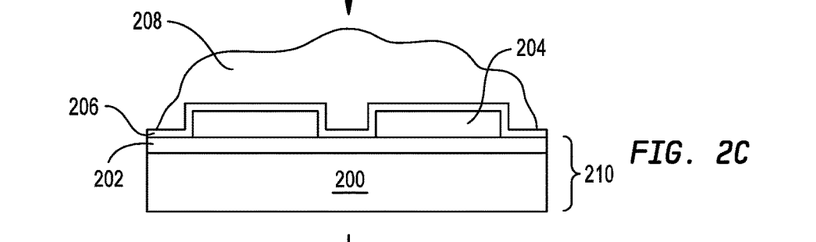

In some embodiments, the method 150 continues at activity 165 with dispensing a molding compound, such as an epoxy, to form a mold layer 208 over the immobilization layer 206 as shown in FIG. 2C. Herein, the molding compound is dispensed using a spin application wherein the molding compound is distributed over the immobilization layer 206 and underlying carrier substrate 210 by spinning the carrier substrate 210 while the molding compound is dispensed thereover and/or thereon. In other embodiments the molding compound is applied to the carrier substrate 210 and the plurality of devices 204 disposed thereon by any conventional molding process, such as pressure/compression molding, injection molding, film assisted molding, or combinations thereof.

Figure 2D:
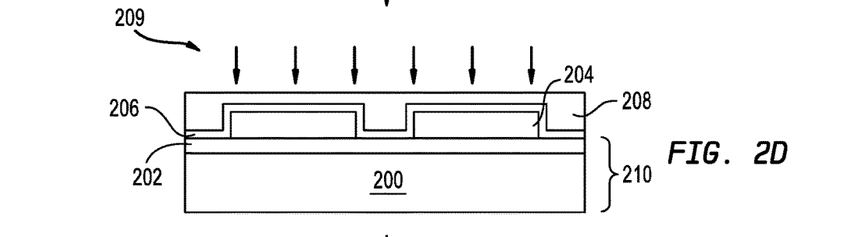
Figure 2E:
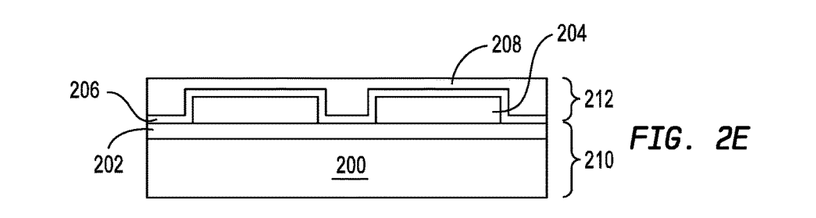

The method 150 continues at activity 175 with curing the molding compound by exposing the molding compound to a UV source 209 as shown in FIG. 2D, by heating the molding compound, by applying curing agents, by vacuum curing, or by a combination thereof, to form a reconstituted substrate 212, as shown in FIG. 2E. In some embodiments the reconstituted substrate 212 is planarized using a back grind process.

The method 150 continues at activity 180 with debonding the reconstituted substrate 212 from the adhesion layer 202 of the carrier substrate 210. In some embodiments, the method 150 further includes forming an electrostatic discharge layer 205 on the carrier substrate 210 and the plurality of devices 204 disposed thereon before or after depositing the immobilization layer 206 thereover, as shown in FIG. 2F.

Figure 2F:
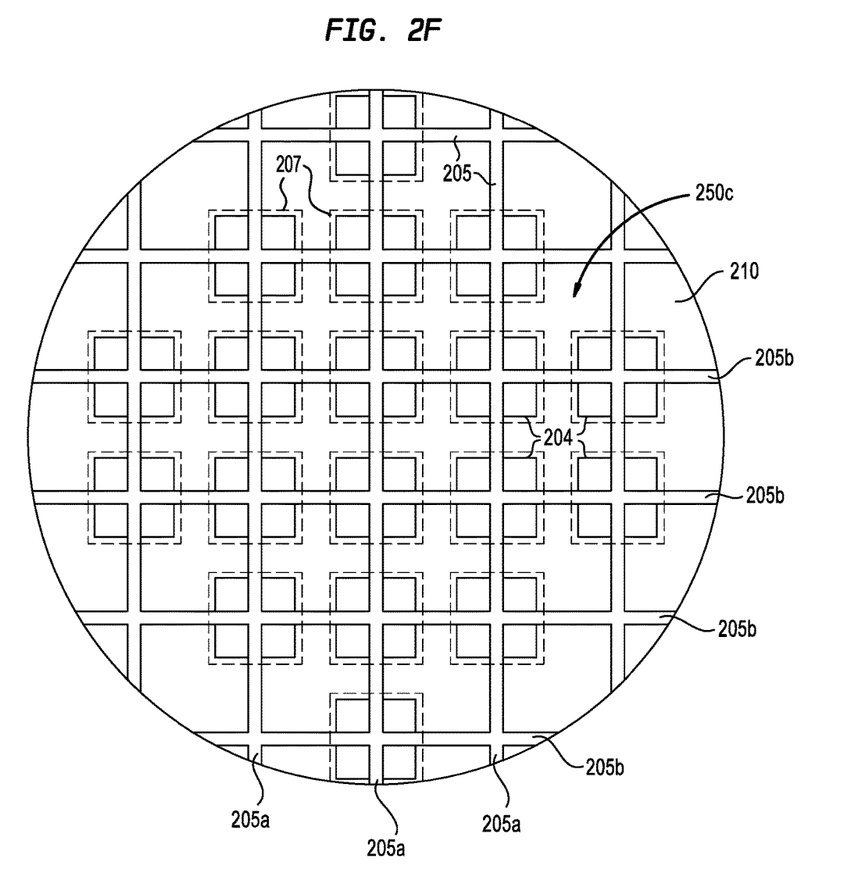
FIG. 2F is a schematic plan view of an electrostatic discharge layer, formed according to further embodiments of FIG. 1B.

FIG. 2F is a schematic plan view of a carrier substrate, such as the carrier substrate 210 described in FIG. 2A, having a plurality of devices 204 disposed thereon, and further having an electrostatic discharge layer 205 disposed over the plurality of devices 204 and the exposed regions of the carrier substrate 210, according to one embodiment. Herein, the electrostatic discharge layer 205 is formed of a conductive polymer, a metal, or a plastic with electrically conducting particles disposed therein. The electrostatic discharge layer 205 is typically formed by printing a conductive polymer or conductive ink, vapor deposition, such as sputtering or evaporative deposition, or by placing a metal mesh netting or gauze like fabric of conductive material on the surface of the carrier substrate 210 and the plurality of devices 204 disposed thereon. Herein, the electrostatic discharge layer 205 comprises a plurality of parallel columns 205a and a plurality of parallel rows 205b that are perpendicular to the plurality of parallel columns 205a. During the formation of the reconstituted substrate and the subsequent formation of redistribution layers thereon, the electrostatic discharge layer 205 is used to dissipate and/or prevent electrostatic charging of the carrier substrate and/or the plurality of devices 204 disposed thereon.

Figure 2G:
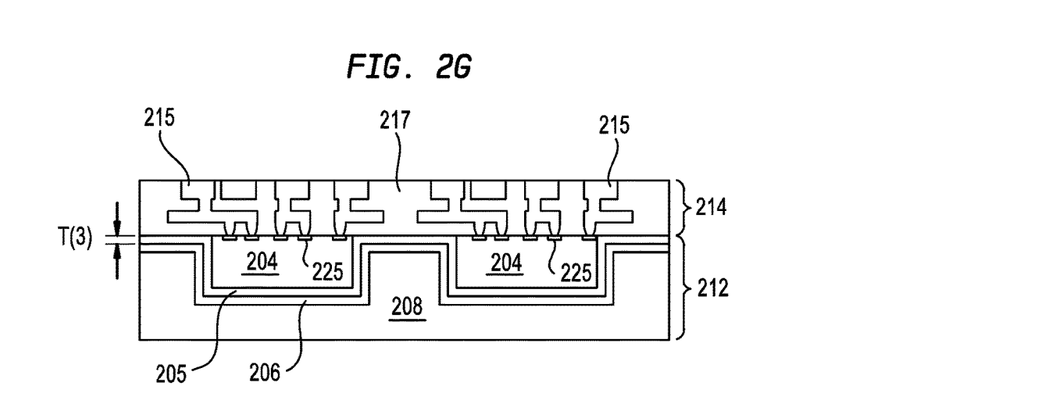
FIGS. 2G-2H illustrate the formation or more redistribution layers on the reconstituted substrate, according to further embodiments of FIG. 1B.
Figure 2H:
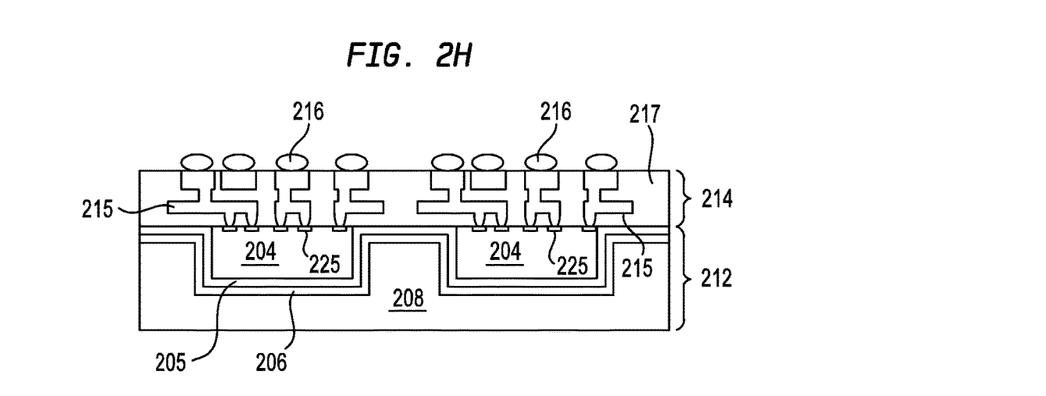

In some embodiments, the method 150 further includes forming one or more redistribution layers 214 on the reconstituted substrate 212, as described in FIGS. 2G-2H.

FIG. 2G shows a reconstituted substrate 212 with one or more redistribution layers 214 disposed thereon. Herein, the reconstituted substrate 212 includes an electrostatic discharge layer 205 interposed between the immobilization layer 206 and the plurality of devices 204 and interposed between the immobilization layer 206 and the one or more redistribution layers 214 in regions between the devices 204. Typically, the electrostatic discharge layer 205 has a thickness T(3) of less than about 100 μm, such as between about 20 μm and about 50 μm. In some embodiments, the electrostatic discharge layer 205 is a metal layer having thickness T(3) of less than about 20 μm, such as between about 0.1 μm and about 2 μm. Each of the one or more redistribution layers 214 comprises a dielectric layer 217, such as an oxide layer, a nitride layer, or a polymer layer, for example a polyimide layer, having a plurality of metal interconnect structures 215 disposed therethrough. Herein, the metal interconnect structures 215 include wire interconnects and/or via interconnects that alone or in combination enable electrical coupling of bond pads 225 of the device 204 to circuits external to the device 204 and the redistribution layers 214. The reconstituted substrate 212 includes the plurality of devices 204 embedded in the cured mold layer 208 with the immobilization layer interposed between each of the plurality of devices 204 and the cured mold layer 208. Herein, the immobilization layer 206 forms a continuous layer over the cured mold layer 208 of the reconstituted substrate 212. In other embodiments, the immobilization layer 206 comprises a discontinuous layer comprising a plurality of immobilization patches 207 (shown in phantom in FIG. 2F) disposed between portions of the cured mold layer 208 and portions of the redistribution layer 214 in locations adjacent to each of the plurality of devices 204 and extending laterally outward therefrom.

Figure 2I:
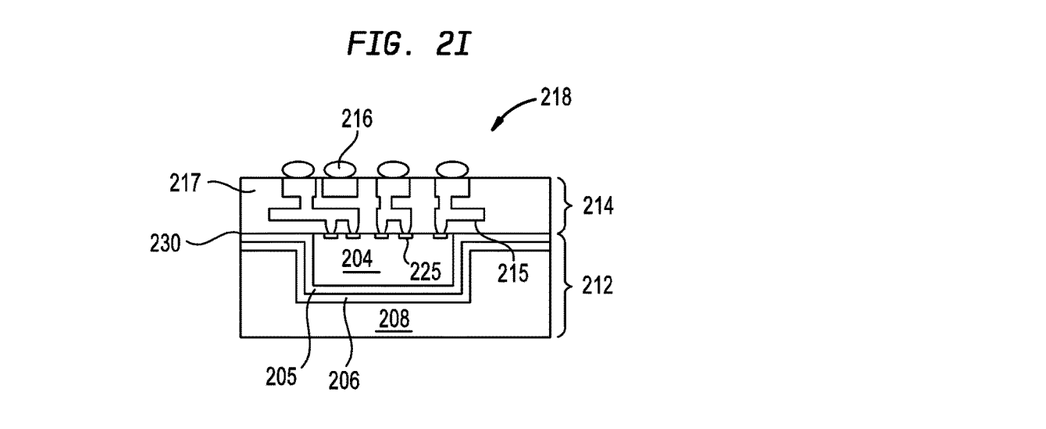
FIG. 2I is a schematic cross-sectional view of a singulated packaged device, formed according to further embodiments of FIG. 1B.

In some embodiments, the method 150 further comprises electrically coupling a plurality of solder balls 216 to the metal interconnect structures 215 and singulating the reconstituted substrate 212 and the layers and features formed thereon, into singulated packaged devices 218 such as shown in FIGS. 2H-2I. FIG. 2H shows the reconstituted substrate 212 of FIG. 2E further comprising an electrostatic discharge layer 205 and further comprising the plurality of solder balls 216 electrically coupled to the plurality of metal interconnect structures 215 of the redistribution layer 214. FIG. 2I shows a singulated packaged device 218 where a first layer of the packaged device, herein a portion of the reconstituted substrate 212, includes the mold layer 208, the immobilization layer 206 (second layer), the electrostatic discharge layer 205 (third layer), and the device 204. Herein, an active surface of the device 204, having bond pads 225 disposed therein, a surface of the electrostatic discharge layer 205 and/or a surface of the immobilization layer 206 disposed between surfaces of the electrostatic discharge layer 205 define a planer surface 230, the redistribution layer 214 disposed thereon. In other embodiments, an active surface of the device 204, having bond pads 225 disposed therein, and a surface of the immobilization layer 206 (second layer) define a planer surface 230, the redistribution layer 214 disposed thereon. Herein, the redistribution layer 214 is separated from the mold layer 208 by the electrostatic discharge layer 205 (third layer) and/or the immobilization layer 206 (second layer) and does not make contact therewith. In other embodiments, at least portions of the redistribution layer 214 are separated from the mold layer 208 by the electrostatic discharge layer 205 (third layer) and/or the immobilization layer 206 (second layer) in regions adjacent to the device 204 and extending laterally outward therefrom.

The method 150 described above immobilizes the device during the molding process of forming the reconstituted substrate, which prevents die shift and reduces process defects related to misalignment of subsequently formed redistribution layers and the contact pads of the device.

Figure 3A:
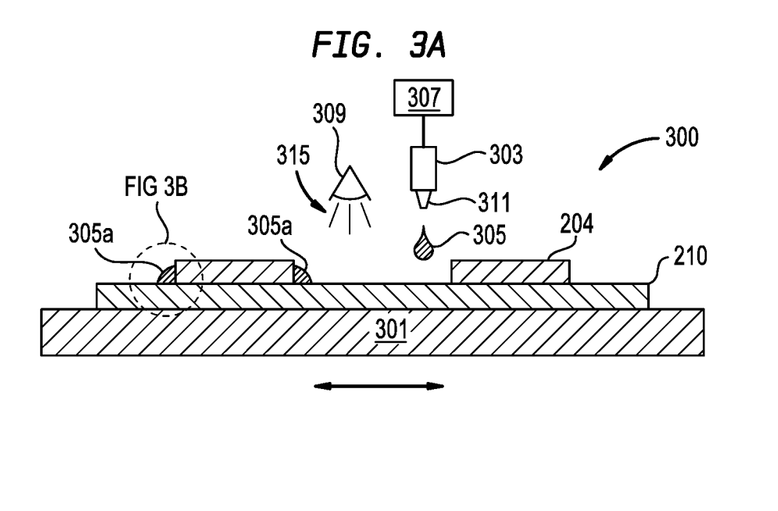
FIG. 3A is a schematic cross-sectional view of an example additive manufacturing system used to practice the method of FIG. 4 according to one embodiment.

FIG. 3A is a schematic view of an example additive manufacturing system 300 used to practice some of the methods described herein, according to one embodiment. Herein the additive manufacturing system 300 comprises a manufacturing support 301, one or more dispense heads, such as dispense head 303, for dispensing droplets 305 of a precursor composition 307, and an electromagnetic radiation source, such as UV source 309. Typically, each of the one or more dispense heads 303 further comprises one or more nozzles 311. The carrier substrate 210, and the plurality of devices 204 disposed thereon, are positioned on the manufacturing support 301 which moves independently of the dispense head 303 to enable dispensing of the droplets 305 on selected locations on the carrier substrate 210 and the plurality of devices 204.

Herein, the precursor composition 307 comprises a mixture of one or more functional polymers, functional oligomers, functional monomers, and/or reactive diluents that are at least monofunctional and undergo polymerization when exposed to free radicals, photoacids, Lewis acids, and/or electromagnetic radiation.

Examples of functional polymers herein include multifunctional acrylates including di, tri, tetra, and higher functionality acrylates, such as 1,3,5-triacryloylhexahydro-1,3,5-triazine or trimethylolpropane triacrylate.

Examples of functional oligomers include monofunctional and multifunctional oligomers, acrylate oligomers, such as aliphatic urethane acrylate oligomers, aliphatic hexafunctional urethane acrylate oligomers, diacrylate, aliphatic hexafunctional acrylate oligomers, multifunctional urethane acrylate oligomers, aliphatic urethane diacrylate oligomers, aliphatic urethane acrylate oligomers, aliphatic polyester urethane diacrylate blends with aliphatic diacrylate oligomers, or combinations thereof, for example bisphenol-A ethoxylate diacrylate or polybutadiene diacrylate. In one embodiment, the functional oligomer comprises tetrafunctional acrylated polyester oligomer available from Annex Corp. of Alpharetta, Ga. as EB40® and the functional oligomer comprises an aliphatic polyester based urethane diacrylate oligomer available from Sartomer USA of Exton, Pa. as CN991.

Examples of monomers used in the precursor composition include tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2-ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl]oxy]ethyl acrylate (e.g. Genomer 1122 from RAHN USA Corporation), 3,3,5-trimethylcyclohexane acrylate, or mono-functional methoxylated PEG (350) acrylate. Multifunctional monomers include diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g., SR9209A from Sartomer®), diethylene glycol diacrylate, diethylene glycol dimethacrylate, dipropylene glycol diacrylate, tripropylene glycol diacrylate, triethylene glycol dimethacrylate, alkoxylated hexanediol diacrylates, or combinations thereof, for example SR562, SR563, SR564 from Sartomer®.

Examples of reactive diluents used in the precursor composition include monoacrylate, 2-ethylhexyl acrylate, octyldecyl acrylate, cyclic trimethylolpropane formal acrylate, caprolactone acrylate, isobornyl acrylate (IBOA), or alkoxylated lauryl methacrylate.

Examples of photoacids used in the precursor composition include onium salts such as Omnicat 250, Omnicat 440, and Omnicat 550, manufactured by manufactured by IGM Resins USA Inc. of Charlotte N.C. and compositional equivalents thereof, triphenylsulfonium triflate, and triarylsulfonium salt type photo acid generators such as CPI-210S available from San-Apro Ltd. of Tokyo, Japan, and compositional equivalents thereof.

In some embodiments, the precursor composition 307 further comprises one or more photoinitiators. Photoinitiators used herein include polymeric photoinitiators and/or oligomer photoinitiators, such as benzoin ethers, benzyl ketals, acetyl phenones, alkyl phenones, phosphine oxides, benzophenone compounds and thioxanthone compounds that include an amine synergist, combinations thereof, and equivalents thereof. For example, in some embodiments photoinitiators include Irgacure® products manufactured by BASF of Ludwigshafen, Germany, or equivalent compositions.

Typically, the precursor composition 307 is formulated to have a viscosity between about 80 cP and about 110 cP at about 25° C., between about 12 cP and about 30 cP at about 70° C., or between 10 cP and about 40 cP for temperatures between about 50° C. and about 150° C. so that the precursor compositions 307 may be effectively dispensed through the nozzles 311 of the one or more dispense heads 303.

Figure 3B:
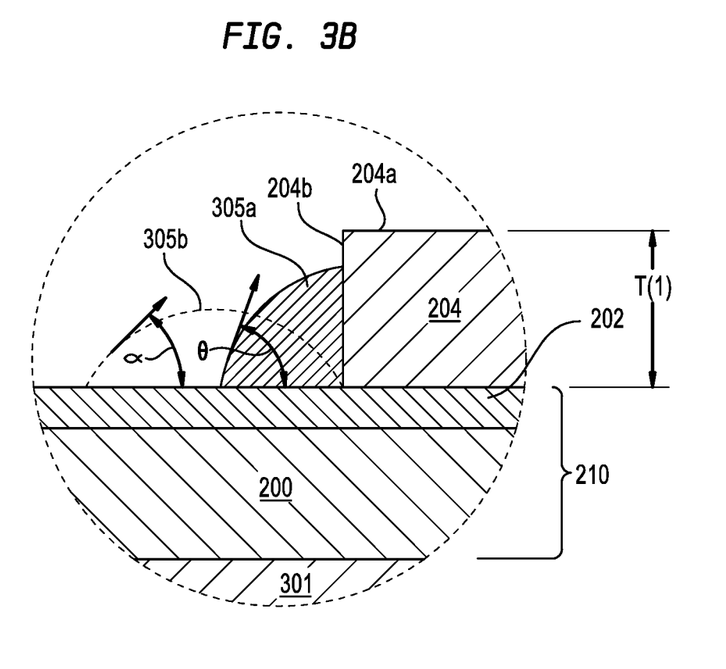
FIG. 3B is a close up cross-sectional view of a portion of the carrier substrate shown in FIG. 3A.

Herein, each of the droplets 305 is at least partially cured using electromagnetic radiation, such as the UV radiation 315 provided by the UV source 309, before the droplet 305 reaches its equilibrium size as described further in FIG. 3B.

Figure 5A:
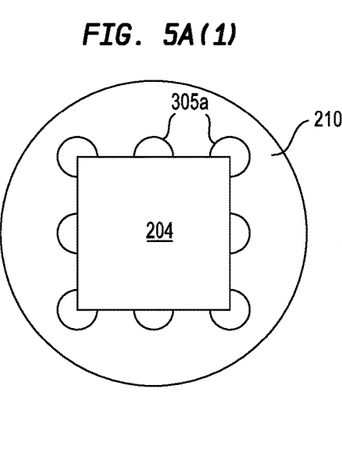
Figure 5B:
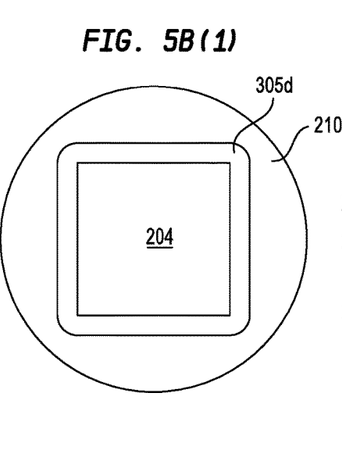

FIG. 3B is a close up cross-sectional view of a portion of the carrier substrate 210 shown in FIG. 3A. Herein, each of the plurality of devices 204 includes a horizontal surface 204a and a one or more vertical surfaces 204b substantially normal to the horizontal surface 204a and substantially normal to the carrier substrate 210 including the adhesion layer 202 thereof. An immobilization bead 305a, of a plurality of immobilization beads 305a (shown in FIG. 5A(1)) formed of an at least partially cured droplet 305 of the precursor composition 307 secures (tacks) the device 204 to the carrier substrate 210 to prevent lateral movement of the device 204 relative to the surface of the carrier substrate 210, or in other words to prevent/and or substantially reduce die shift during the formation of a reconstituted substrate.

Typically, an uncured dispensed droplet, such as the example uncured dispensed droplet 305b, will spread to an equilibrium size having an equilibrium contact angle α within a very short period of time, such as less than about 1 second, from the moment the droplet 305 first comes into contact with a surface of the carrier substrate 210 and/or a surface of one of the plurality of devices 204 disposed thereon. Therefore, herein, the droplets 305 are at least partially cured (fixed) by exposure thereof to UV radiation 315 from the UV source 309 to form the immobilization bead 305a having a fixed contact angle θ that is greater than the equilibrium contact angle α. Herein, the fixed contact angle θ of the immobilization bead 305a is desirably controlled to a value of greater than about 50°, such as greater than about 55°, greater than about 60°, or greater than about 70°, or even greater than about 80°. The immobilization bead 305a herein covers at least a portion of the vertical surface 204b of the device 204 and a portion of the carrier substrate 210, including the adhesion layer 202 thereof, adjacent to the device 204 and extending laterally outward therefrom.

Figure 4:
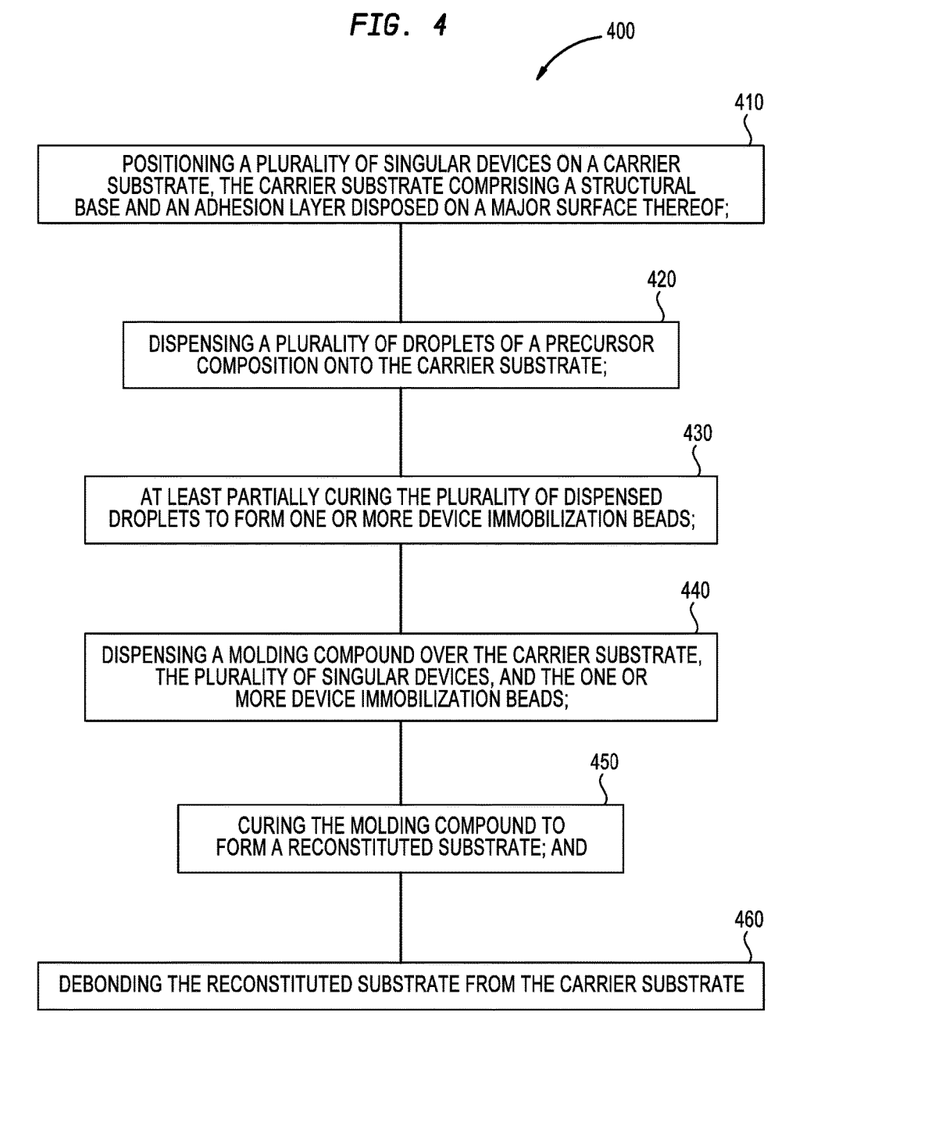
FIG. 4 is a flow diagram illustrating a method of forming a reconstituted substrate using the additive manufacturing system described in FIG. 3A.

FIG. 4 is a flow diagram illustrating a method of forming a reconstituted substrate using the additive manufacturing system 300 described in FIG. 3A.

The method 400 begins at activity 410 with the positioning of a plurality of devices, i.e., individual singulated dies, on a carrier substrate, such as the carrier substrate 210 illustrated in FIG. 2A. In some embodiments, the method further includes forming an electrostatic discharge layer, such as the electrostatic discharge layer 205 described in FIG. 2F or other embodiments of the electrostatic discharge layer 205 described herein, on the carrier substrate 210 and the plurality of devices 204 disposed thereon.

The method 400 continues at activity 420 with dispensing a plurality of droplets of a precursor composition onto the carrier substrate at a location adjacent to a vertical portion of a device 204 and at least partially curing each of the plurality of dispensed droplets at activity 430 to form a plurality of immobilization beads, as shown in FIGS. 5A(1)-A(2).

FIG. 5A(1) is a schematic plan view of a device 204 disposed on a carrier substrate 210, according to one embodiment. FIG. 5A(2) is a side view of the device 204 shown in FIG. 5A(1) further showing (in phantom) an electrostatic discharge layer 205 and the mold layer 208 disposed thereon. Herein, a plurality of immobilization beads 305a prevent lateral movement of the device 204 in relation to the carrier substrate 210 during the formation of the mold layer 208 (as shown in FIGS. 2C-2E). Typically, the immobilization beads 305a are located at the corners of the device 204, are located between the corners of the device 204, or a combination thereof. Each of the immobilization beads 305a covers at least a portion of the one or more vertical surfaces 204b (shown in FIG. 3B) of the device 204 and at least a portion of the carrier substrate 210 adjacent to the vertical surface 204b and extending laterally outward therefrom. In some embodiments, an electrostatic discharge layer 205 (shown in phantom in FIG. 5B) such as the electrostatic discharge layer 205 described in FIG. 2F, is interposed between each of the immobilization beads 305a and the device 204 and/or the carrier substrate 210. In some other embodiments, the electrostatic discharge layer is interposed between portions of the immobilization beads 305a and/or some of the immobilization beads 305a and the device 204 and/or the carrier substrate.

In other embodiments, the droplets 305 are dispensed to form an immobilization patch over the device 204 and portions of the carrier substrate 210 adjacent thereto and extending laterally outward therefrom.

In some embodiments, a plurality of droplets 305 are dispensed and at least partially cured to form a continuous immobilization bead layer 305d about the perimeter of the device 204 as shown in FIGS. 5B(1) and 5B(2). FIG. 5B(1) is a schematic plan view of a device 204 disposed on a carrier substrate 210, according to one embodiment. FIG. 5B(2) is a side view of the device 204 shown in FIG. 5B(1) further showing (in phantom) the electrostatic discharge layer 205 and the mold layer 208 disposed thereon. Herein, the immobilization bead layer 305d forms a continuous surface about the perimeter of the device 204 and prevents lateral movement of the device 204 in relation to the carrier substrate 210 during the formation of the mold layer 208 (as shown in FIGS. 2C-2E).

In some embodiments, the method 400 further includes UV curing the immobilization beads 305a, and or immobilization bead layers 305d in a UV furnace for between about 5 minutes and about 2 hours, such as between about 5 minutes and about 90 minutes, or about 1 hour, at a curing temperature between about 50° C. and about 200° C., such as between about 50° C. and about 150° C., or less than about 150° C.

The method 400 continues at activity 440 with dispensing a molding compound over the carrier substrate, the plurality of singular devices, and the immobilization layer thereon, at activity 450 with curing the molding compound to form a reconstituted substrate 512a (shown in FIG. 5B(1)) or 512b (shown in FIG. 5B(2)), and activity 460 with debonding the reconstituted substrate from the carrier, which correspond to activities 165, 175, and 180 respectively of method 150 described in FIG. 1B.

In some embodiments, the method 400 further includes forming one or more redistribution layers on the reconstituted substrate 212, as described above in FIG. 2G.

The method 400 described above immobilizes the device during the molding process of forming the reconstituted substrate, which prevents die shift and reduces process defects related to misalignment of subsequently formed redistribution layers and the contact pads of the device.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a reconstituted substrate, comprising:
    positioning a plurality of singular devices on a carrier substrate, the carrier substrate comprising a structural base and an adhesion layer disposed on a major surface thereof, wherein active surfaces of the plurality of singular devices are temporarily secured to the structural base by the adhesion layer; and
    depositing a device immobilization layer onto the plurality of singular devices and onto at least a portion of the carrier substrate adjacent thereto and extending laterally outward therefrom, wherein depositing the device immobilization layer comprises:
        flowing a processing gas comprising one or more monomers and one or more initiator precursors into a processing volume of a processing chamber;
        catalytically dissociating the one or more initiator precursors into reactive species thereof using a plurality of heating elements disposed in the processing volume; and
        forming the device immobilization layer over the plurality of singular devices and the carrier substrate therebetween.

2. The method of claim 1, wherein the device immobilization layer comprises a polymerized reaction product of the one or more monomers and the dissociated one or more initiator precursors.

3. The method of claim 1, wherein the one or more monomers are selected from the group consisting of ethyleneglycol diacrylate, t-butylacrylate, N,N-dimethylacrylamide, vinylimidazole, 1-3-diethynylbenzene, 4-vinyl pyridine, poly vinyl pyridine, poly 4-vinyl pyridine, polyphenylacetylene, N,N-dimethylaminoethylmethacrylate, divinylbenzene, poly divinylbenzene, glycidyl methacrylate, poly thiophene, ethyleneglycol dimethacrylate, tetrafluoroethylene, dimethylaminomethylstyrene, perfluoroalkyl ethylmethacrylate, trivinyltrimethoxy-cyclotrisiloxane, furfuryl methacrylate, cyclohexyl methacrylate-co-ethylene glycol dimethacrylate, pentafluorophenyl methacrylate-co-ethylene glycol diacrylate, 2-hydroxyethyl methacrylate, methacrylic acid, 3,4-ethylenedioxythiophene, and combinations thereof.

4. The method of claim 1, wherein the one or more initiator precursors are selected from the group consisting of hydrogen peroxide, alkyl peroxides, aryl peroxides, hydroperoxides, halogens, azo compounds, and combinations thereof.

5. The method of claim 2, wherein the device immobilization layer comprises a continuous layer disposed over a surface of the carrier substrate and the plurality of singular devices disposed thereon.

6. The method of claim 2, wherein the device immobilization layer comprises a discontinuous layer comprising a plurality of immobilization patches disposed over the plurality of singular devices and portions of the carrier substrate adjacent thereto and extending laterally outward therefrom.

7. The method of claim 1, further comprising depositing an electrostatic discharge layer over the carrier substrate and the plurality of singular devices disposed thereon.

8. The method of claim 2, wherein the polymerized reaction product comprises poly(glycidyl methacrylate-co-divinylbenzene), poly(glycidyl methacrylate-co-methacrylamide), poly(ethyleneglycol diacrylate), poly(t-butylacrylate), poly N,N-dimethylacrylamide, poly(vinylimidazole), poly(1-3-diethynylbenzene), poly(phenylacetylene), poly (N,N-dimethylaminoethylmethacrylate) (p(DMAM), poly (divinylbenzene), poly(glycidyl methacrylate) (p(GMA)), poly (ethyleneglycol dimethacrylate), poly (tetrafluoroethylene), poly(tetrafluoroethylene) (PTFE), poly(dimethylaminomethylstyrene) (p(DMAMS), poly(thiophene), poly(vinylpyridine), poly(perfluoroalkyl ethylmethacrylate), poly (trivinyltrimethoxy-cyclotrisiloxane), poly(furfuryl methacrylate), poly(cyclohexyl methacrylate-co-ethylene glycol dimethacrylate), poly(pentafluorophenyl methacrylate-co-ethylene glycol diacrylate), poly(2-hydroxyethyl methacrylate-co-ethylene glycol diacrylate), poly(methacrylic acid-co-ethylene glycol dimethacrylate), poly(3,4-ethylenedioxythiophene), or combinations thereof.

9. The method of claim 8, wherein the polymerized reaction product comprises poly(glycidyl methacrylate) (p(GMA)).

10. The method of claim 1, wherein the device immobilization layer has a thickness between about 0.5 μm and about 100 μm.

11. The method of claim 1, further comprising:
    dispensing a molding compound over the carrier substrate, the plurality of singular devices, and the device immobilization layer thereon;
    curing the molding compound to form a reconstituted substrate; and
    debonding the reconstituted substrate from the carrier substrate.

12. A method of forming a reconstituted substrate, comprising:
    positioning a plurality of singular devices on a carrier substrate, the carrier substrate comprising a structural base and an adhesion layer disposed on a major surface thereof, wherein active surfaces of the plurality of singular devices are temporarily secured to the structural base by the adhesion layer;

dispensing a plurality of droplets of a precursor composition onto the carrier substrate at locations adjacent to each of the plurality of singular devices;

at least partially curing each of the plurality of droplets to form a plurality of device immobilization beads;

dispensing a molding compound over the carrier substrate, the plurality of singular devices, and the plurality of device immobilization beads thereon;

curing the molding compound to form a reconstituted substrate; and debonding the reconstituted substrate from the carrier substrate.

13. The method of claim 12, wherein the precursor composition comprises a mixture of one or more functional polymers, functional oligomers, functional monomers, or reactive diluents.

14. The method of claim 12, wherein at least partially curing each of the plurality of droplets results in a device immobilization bead that has a contact angle that is greater than the equilibrium contact angle of an uncured droplet.

15. The method of claim 12, further comprising depositing an electrostatic discharge layer over the carrier substrate and the plurality of singular devices disposed thereon.

16. The method of claim 12, wherein each of the plurality of device immobilization beads covers at least a portion of a vertical surface of a respective singular device and a portion of the carrier substrate adjacent thereto and extending laterally outward therefrom.

17. The method of claim 12, wherein the plurality of device immobilization beads form a continuous surface about a perimeter of each of the plurality of singular devices.

* * * * *